(12) United States Patent
Higuchi et al.

(10) Patent No.: US 11,526,158 B2
(45) Date of Patent: Dec. 13, 2022

(54) DISPLAY DEVICE, MANUFACTURING SYSTEM, AND DISPLAY METHOD

(71) Applicant: PANASONIC INTELLECTUAL PROPERTY MANAGEMENT CO., LTD., Osaka (JP)

(72) Inventors: Yuichi Higuchi, Osaka (JP); Hiroshi Amano, Osaka (JP); Yosuke Tajika, Hyogo (JP); Taichi Shimizu, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/628,928

(22) PCT Filed: Jul. 10, 2018

(86) PCT No.: PCT/JP2018/026095
§ 371 (c)(1),
(2) Date: Jan. 6, 2020

(87) PCT Pub. No.: WO2019/013225
PCT Pub. Date: Jan. 17, 2019

(65) Prior Publication Data
US 2020/0192339 A1 Jun. 18, 2020

(30) Foreign Application Priority Data

Jul. 14, 2017 (JP) .............................. JP2017-138094

(51) Int. Cl.
| | | |
|---|---|---|
| *G05B 19/418* | (2006.01) | |
| *H05K 13/08* | (2006.01) | |
| *G06Q 50/04* | (2012.01) | |

(52) U.S. Cl.
CPC ....... *G05B 19/41875* (2013.01); *G06Q 50/04* (2013.01); *H05K 13/083* (2018.08); *G05B 2219/32366* (2013.01)

(58) Field of Classification Search
CPC .... Y02P 90/02; Y02P 90/30; G05B 19/41875; G05B 19/418; G05B 2219/31455;
(Continued)

(56) References Cited

U.S. PATENT DOCUMENTS

| | | | | |
|---|---|---|---|---|
| 6,259,959 B1 * | 7/2001 | Martin | ................... | G06Q 10/06 700/99 |
| 6,556,949 B1 * | 4/2003 | Lyon | ................ | G05B 19/41875 702/182 |

(Continued)

FOREIGN PATENT DOCUMENTS

| | | |
|---|---|---|
| JP | H06-037497 A | 2/1994 |
| JP | H10-198403 A | 7/1998 |

(Continued)

OTHER PUBLICATIONS

International Search Report and Written Opinion dated Sep. 25, 2018 in International Application No. PCT/JP2018/026095; with partial English translation.

(Continued)

*Primary Examiner* — Darrin D Dunn
(74) *Attorney, Agent, or Firm* — McDermott Will & Emery LLP

(57) ABSTRACT

A display device that displays productivity of a manufacturing facility that performs processes to manufacture products, wherein the manufacturing facility includes constituent element groups, each including constituent elements, constituent elements selected from the constituent element groups perform a corresponding one of the processes. The display device includes: an obtainer that obtains manufac-
(Continued)

turing log information from the manufacturing facility; a calculator that calculates an indicator showing productivity of each combination of a first constituent element and a second constituent element, based on the manufacturing log information; and a display that displays the indicator showing the productivity of each combination at a position of an intersection point corresponding to the combination on a productivity indicator map including a vertical axis along which first constituent elements are arranged and a horizontal axis along which second constituent elements are arranged.

13 Claims, 9 Drawing Sheets

(58) Field of Classification Search
CPC ......... G05B 2219/31472; G05B 2219/32179; G05B 2219/32366; G06F 11/323; G06F 11/3419; G06F 11/3452; G06F 16/285; G06F 2201/86; H05K 13/083; G06Q 50/04

See application file for complete search history.

(56) References Cited

U.S. PATENT DOCUMENTS

| | | | | |
|---|---|---|---|---|
| 6,580,960 | B1* | 6/2003 | Nicholson | H01L 22/20 257/E21.525 |
| 7,337,033 | B1* | 2/2008 | Ontalus | G05B 19/41875 700/109 |
| 7,783,455 | B1* | 8/2010 | Coss, Jr. | G05B 23/0237 702/183 |
| 8,648,860 | B2* | 2/2014 | Vrba | G07C 3/12 345/440 |
| 10,054,936 | B2* | 8/2018 | Gobalakrishnan | G06Q 10/0637 |
| 10,101,735 | B2* | 10/2018 | Tiano | G05B 19/41875 |
| 2003/0225471 | A1* | 12/2003 | Tseng | G05B 19/4187 700/108 |
| 2008/0301679 | A1 | 12/2008 | Osogami | |
| 2012/0130523 | A1* | 5/2012 | Schmidt | G05B 17/02 700/100 |
| 2012/0215335 | A1* | 8/2012 | Baseman | G05B 19/41875 700/99 |
| 2013/0006406 | A1* | 1/2013 | Aharoni | G05B 23/0229 700/97 |
| 2015/0039652 | A1* | 2/2015 | Kapoustin | G06F 16/2448 707/779 |
| 2015/0153730 | A1* | 6/2015 | Nishimura | G05B 19/41875 700/109 |
| 2017/0293289 | A1* | 10/2017 | Kobayashi | G05B 19/4188 |
| 2018/0129991 | A1* | 5/2018 | Takahashi | G06T 11/206 |
| 2018/0189990 | A1* | 7/2018 | Cardno | G06Q 10/10 |
| 2020/0143095 | A1* | 5/2020 | Kothari | G06F 30/20 |

FOREIGN PATENT DOCUMENTS

| | | |
|---|---|---|
| JP | H11-267952 A | 10/1999 |
| JP | 2002-182729 A | 6/2002 |
| JP | 2008-299531 A | 12/2008 |
| JP | 2011-107882 A | 6/2011 |
| JP | 2015-108904 A | 6/2015 |

OTHER PUBLICATIONS

Japanese Office Action dated Apr. 12, 2022 issued in the corresponding Japanese Patent Application No. 2019-529743.
Japanese Office Action dated Jun. 14, 2022 issued in the corresponding Japanese Patent Application No. 2019-529743.

* cited by examiner

| Process | Process record | | Unit A group | Unit B group | Unit C group |
|---|---|---|---|---|---|
| | Time | Failure flag | | | |
| P001 | MM/DD/YY hh:mm:ss | 0 | A001 | B001 | C001 |
| P002 | ... | 1 | A001 | B002 | C001 |
| P003 | ... | 0 | A001 | B003 | C001 |
| P004 | ... | 0 | A002 | B004 | C001 |
| P005 | ... | 0 | A003 | B005 | C001 |
| P006 | ... | 0 | A001 | B001 | C002 |

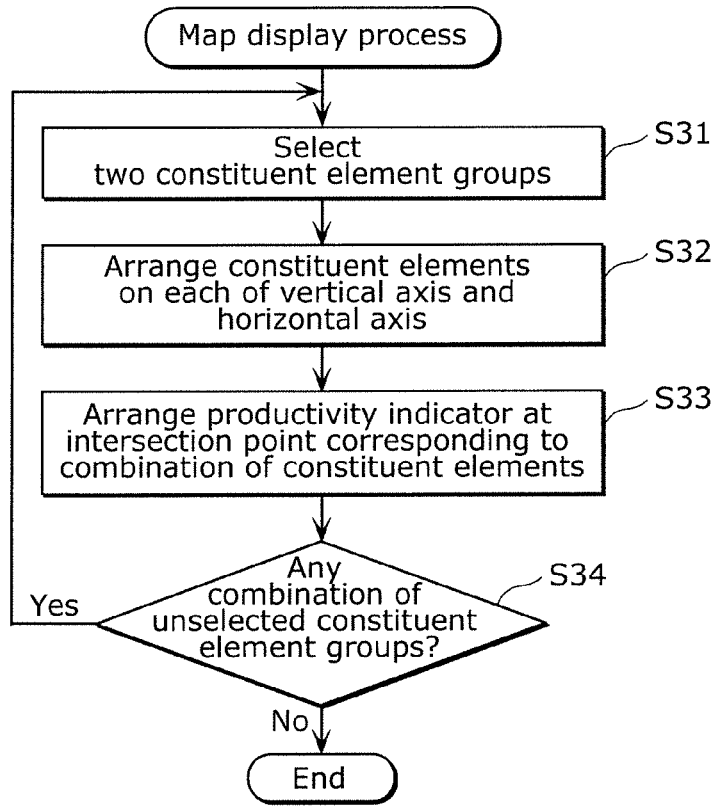
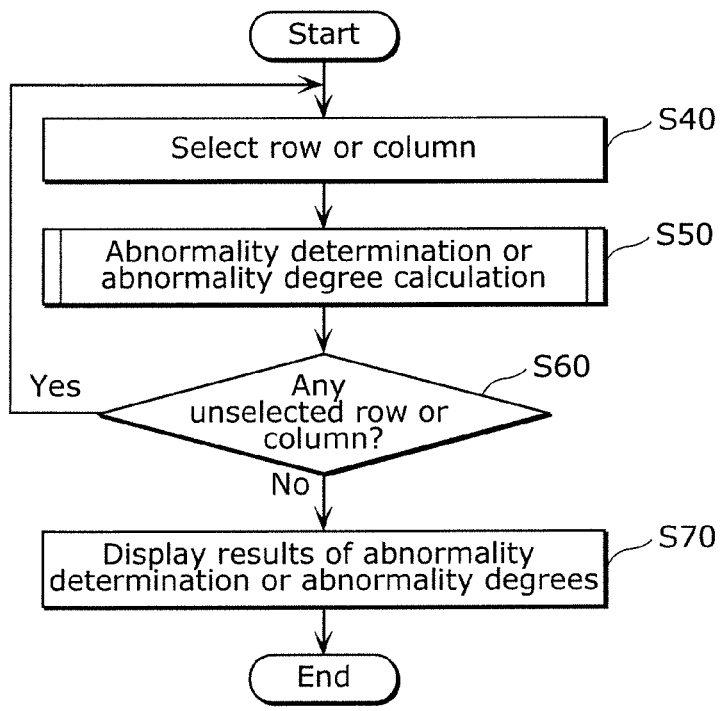

| Unit A group | Abnormality determination | Abnormality degree |
|---|---|---|
| A001 | Normal | Low |
| A002 | Abnormal | High |
| A003 | Normal | Low |
| A004 | Normal | Low |
| A005 | Normal | Low |
| ⋮ | ⋮ | ⋮ |

DISPLAY DEVICE, MANUFACTURING SYSTEM, AND DISPLAY METHOD

CROSS-REFERENCE OF RELATED APPLICATIONS

This application is the U.S. National Phase under 35 U.S.C. § 371 of International Patent Application No. PCT/JP2018/026095, filed on Jul. 10, 2018, which in turn claims the benefit of Japanese Application No. 2017-138094, filed on Jul. 14, 2017, the entire disclosures of which Applications are incorporated by reference herein.

TECHNICAL FIELD

The present disclosure relates to a display system that displays the productivity of a manufacturing facility, a manufacturing system that includes the display device, and a display method.

BACKGROUND ART

There is a conventionally known technology for displaying a manufacturing status (for example, see Patent Literature (PTL) 1). Such technology enables to identify an abnormality that has occurred in a manufacturing facility, on the basis of a manufacturing status displayed, and cope with such abnormality having occurred.

CITATION LIST

Patent Literature

[PTL 1] Japanese Unexamined Patent Application Publication No. 6-37497

SUMMARY OF INVENTION

Technical Problem

In general, one step involves a plurality of constituent elements. For example, a component suction step involves not only a nozzle for component suction, but also various constituent elements such as a header for holding the nozzle, a feeder for feeding components, and components to be sucked. For this reason, the mere identification of an abnormality in the suction step does not enable to estimate the probable cause of such abnormality; which one of the nozzle, the header, the feeder, the components, etc. the abnormality is attributable to. This requires time to identify the cause of the abnormality, leading to reduction in the production efficiency and the quality of the products.

In view of the above, the present disclosure provides a display device, a manufacturing system, and a display method that help to prevent the reduction in the production efficiency and the quality of products.

Solution to Problem

In order to solve the above problem, the display device according to one aspect of the present disclosure is a display device that displays productivity of a manufacturing facility that performs a plurality of processes to manufacture products. Here, the manufacturing facility includes a plurality of constituent element groups, each including a plurality of constituent elements, a plurality of constituent elements selected from the plurality of constituent element groups perform a corresponding one of the plurality of processes, the plurality of constituent element groups include a first constituent element group including a plurality of first constituent elements and a second constituent element group including a plurality of second constituent elements. Such display device includes: an obtainer that obtains manufacturing log information from the manufacturing facility; a calculator that calculates an indicator showing productivity of each of combinations of one of the plurality of first constituent elements and one of the plurality of second constituent elements, based on the manufacturing log information; and a display that displays the indicator showing the productivity of each of the combinations at a position of an intersection point corresponding to the combination on a grid map including a first axis along which the plurality of first constituent elements are arranged and a second axis along which the plurality of second constituent elements are arranged.

The manufacturing system according to another aspect of the present disclosure includes the display device and the manufacturing facility.

The display method according to another aspect of the present disclosure is a display method of displaying productivity of a manufacturing facility that performs a plurality of processes to manufacture products. Here, the manufacturing facility includes a plurality of constituent element groups, each including a plurality of constituent elements, a plurality of constituent elements selected from the plurality of constituent element groups perform a corresponding one of the plurality of processes, the plurality of constituent element groups include a first constituent element group including a plurality of first constituent elements and a second constituent element group including a plurality of second constituent elements. Such display method includes: obtaining manufacturing log information from the manufacturing facility; calculating an indicator showing productivity of each of combinations of one of the plurality of first constituent elements and one of the plurality of second constituent elements, based on the manufacturing log information; and displaying the indicator showing the productivity of each of the combinations at a position of an intersection point corresponding to the combination on a grid map including a first axis along which the plurality of first constituent elements are arranged and a second axis along which the plurality of second constituent elements are arranged.

Note that an aspect of the present disclosure can be embodied as a program that causes the above-described method to be performed in a computer. Alternatively, an aspect of the present disclosure can be embodied as a computer-readable recording medium storing such program.

Advantageous Effects of Invention

The present disclosure is capable of helping to prevent the reduction in the production efficiency and the quality of products.

BRIEF DESCRIPTION OF DRAWINGS

FIG. 8 is a flowchart of processes of displaying the productivity indicator maps performed by the display device according to Embodiment 1.

FIG. 9 is a flowchart of a second operation performed by the display device according to Embodiment 1.

DESCRIPTION OF EMBODIMENTS

Overview of the Present Disclosure

Figure 1:
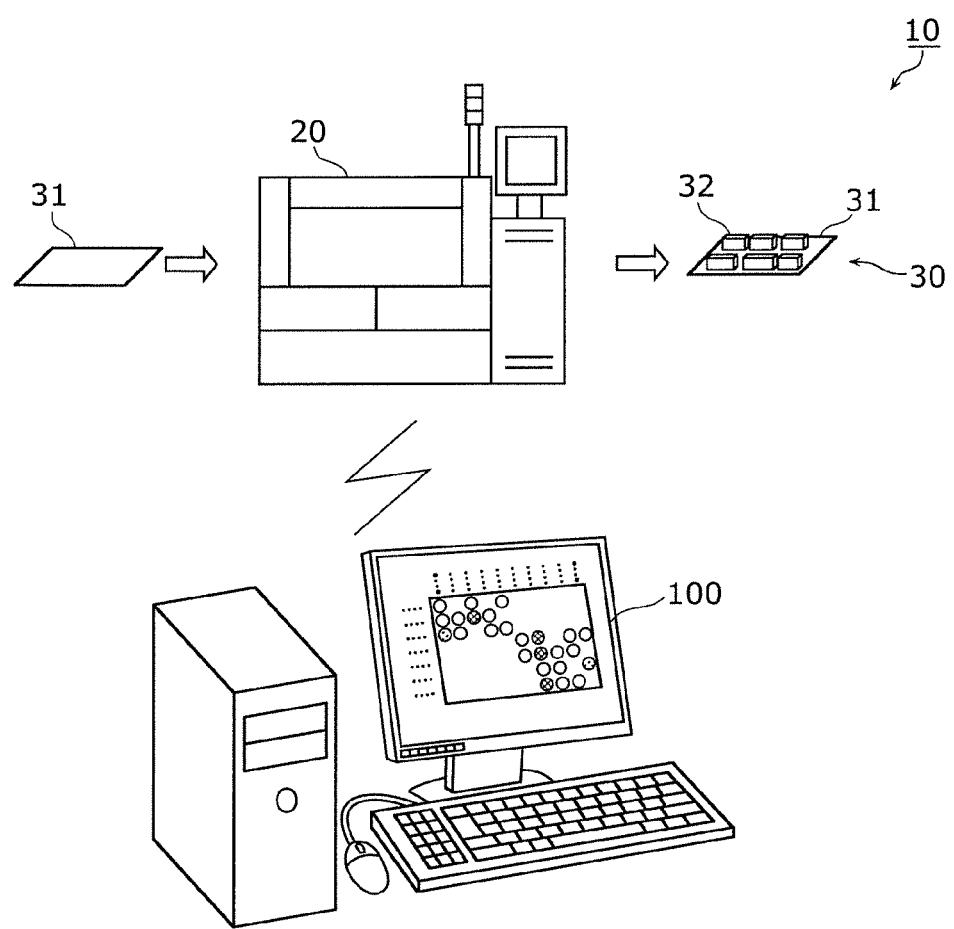
FIG. 1 is a diagram showing the configuration of a manufacturing system according to Embodiment 1.

In order to solve the above problem, the display device according to one aspect of the present disclosure is a display device that displays productivity of a manufacturing facility that performs a plurality of processes to manufacture products. Here, the manufacturing facility includes a plurality of constituent element groups, each including a plurality of constituent elements, a plurality of constituent elements selected from the plurality of constituent element groups perform a corresponding one of the plurality of processes, the plurality of constituent element groups include a first constituent element group including a plurality of first constituent elements and a second constituent element group including a plurality of second constituent elements. Such display device includes: an obtainer that obtains manufacturing log information from the manufacturing facility; a calculator that calculates an indicator showing productivity of each of combinations of one of the plurality of first constituent elements and one of the plurality of second constituent elements, based on the manufacturing log information; and a display that displays the indicator showing the productivity of each of the combinations at a position of an intersection point corresponding to the combination on a grid map including a first axis along which the plurality of first constituent elements are arranged and a second axis along which the plurality of second constituent elements are arranged.

This configuration two-dimensionally displays the indicators, each representing the productivity of each combination of a plurality of constituent elements, and thus enables an easy recognition of whether the productivity is good or poor on a constituent element basis. This thus enables an easier estimation of a constituent element with poor productivity.

As thus described, the display device according to the present aspect enables an easier estimation of a constituent element with poor productivity, allowing for quick handling of the constituent element with poor productivity. The display device according to the present aspect is thus capable of helping to prevent the reduction in the production efficiency and the quality of products.

For example, the calculator may further perform a statistical process on each of rows or columns that lie along one of the first axis and the second axis on the grid map to perform one of: a determination of presence or absence of an abnormality in the plurality of constituent elements corresponding to the row or the column; and a calculation of an abnormality degree of the plurality of constituent elements corresponding to the row or the column, and the display may further display a result of the determination or the abnormality degree.

This configuration displays the results of abnormality determinations or abnormality degrees of the constituent elements, enabling quicker handling of a constituent element with poor productivity. This saves a person in charge, such as a maintenance worker, a manufacturing worker (operator), a manager of the manufacturing location, a person responsible for production management, from the trouble of inspecting and identifying the point of an abnormality. This thus enables quick handling of a constituent element displayed.

For example, for each of the plurality of processes, the manufacturing log information may show corresponding ones of the plurality of constituent elements that have performed the process and a record of the process in association with each other.

This configuration enables an accurate calculation of a productivity indicator of each constituent element, and thus improves the accuracy of estimating a constituent element with poor productivity. The improved accuracy of estimating a constituent element with poor productivity allows for quicker handling of such constituent element. The display device according to the present aspect is thus more capable of helping to prevent the reduction in the production efficiency and the quality of products.

For example, the record may show at least one of: presence or absence of an error that has occurred during the process associated with the record; start time of the process; end time of the process; or a determination result of whether the process has succeeded or failed.

This configuration enables an accurate calculation of a productivity indicator of each constituent element, and thus improves the accuracy of estimating a constituent element with poor productivity. For example, the difference between the start time and the end time of a process corresponds to the time required for the process. In a series of the same processes, a process that has spent a longer time than other processes results in lower productivity. As thus described, the calculation of a productivity indicator is possible on the basis of the time required for the process.

For example, the record may show at least one of start time of the process associated with the record or end time of the process, and the calculator may further calculate the indicator based on information, included in the manufacturing log information, in which at least one of the start time of the process or the end time of the process falls within a predetermined data collection period.

This configuration enables an accurate calculation of a productivity indicator of each constituent element corresponding to a specified data collection period. This reduces the amount of processing required for calculating indicators, thus resulting in reduction in time and power consumption required for calculation.

For example, the display device according to the present aspect supports a short data collection period of one to tens of minutes or one to some hours, thereby enabling highly real-time data display. This allows for the improvement of a manufacturing step in a maintenance work, for example, such as the replacement of structural elements, every time an abnormality occurs. Stated differently, this saves the trouble of regularly conducting general maintenance work. The display device according to the present aspect thus reduces the length of time to stop the manufacturing line, resulting in improved production efficiency.

For example, the display device according to one aspect of the present disclosure may further include: an acceptor that accepts two of the plurality of constituent element groups selected by a user, and the calculator may calculate the indicator, with the two of the plurality of constituent element groups accepted by the acceptor serving as the first constituent element group and the second constituent element group.

This configuration enables an accurate calculation of a productivity indicator of each constituent element corresponding to a specified constituent element group. This reduces the amount of processing required for calculating indicators, thus resulting in reduction in time and power consumption required for calculation.

For example, the grid map may be a heat map that represents the indicator by variations in color or size.

This configuration displays whether each productivity is good or poor by color or size in a visually easy to recognize manner. This thus enables an easy estimation of a constituent element with poor productivity.

For example, the indicator may include at least one of: (a) a total number of failure processes determined as having failed among one or more of the plurality of processes corresponding to each of the combinations; (b) a failure rate which is a rate of processes determined as having failed among one or more of the plurality of processes corresponding to each of the combinations; (c) an error frequency which is a frequency of error occurrence among one or more of the plurality of processes corresponding to each of the combinations; (d) an occurrence interval which is a time interval at which processes determined as having failed were performed among one or more of the plurality of processes corresponding to each of the combinations; (e) production time which is time required for one or more of the plurality of processes corresponding to each of the combinations; (f) standby time which is time to wait to perform one or more of the plurality of processes corresponding to each of the combinations; (g) termination time which is time during which one or more of the plurality of processes corresponding to each of the combinations were terminated; (h) a yield of the products manufactured by performing one or more of the plurality of processes corresponding to each of the combinations; (i) a production plan ratio of the products manufactured by performing one or more of the plurality of processes corresponding to each of the combinations; (j) an inspection result of inspecting the products manufactured by performing one or more of the plurality of processes corresponding to each of the combinations; or (k) a statistics value calculated by statistically processing at least one of (a) to (j).

This configuration displays the productivity indicators in a manner that is easy for a maintenance worker or an operator, etc. to understand. This enables an easier estimation of a constituent element with poor productivity and the degree of poorness of the productivity of the constituent element. This thus enables quick and appropriate handling of such constituent element.

For example, the plurality of constituent element groups may further include a third constituent element group including a plurality of third constituent elements, and the calculator may further calculate the indicator showing productivity of each of combinations of one of the plurality of first constituent elements, one of the plurality of second constituent elements, and one of the plurality of third constituent elements, based on the manufacturing log information.

This configuration displays on a single screen the indicator representing the productivity of each combination of three constituent elements. This thus enables relationships among constituent elements to be easily understood, allowing for an easier estimation of a constituent element with poor productivity.

For example, the grid map may be a three-dimensional grid map that further includes a third axis along which the plurality of third constituent elements are arranged.

This configuration displays on a single screen the indicator representing the productivity of each combination of three constituent elements in an easy to understand manner. This thus enables relationships among constituent elements to be more easily understood, allowing for an easier estimation of a constituent element with poor productivity.

The manufacturing system according to another aspect of the present disclosure includes the above-described display device and the above-described manufacturing facility.

Such display device helps to prevent the reduction in the production efficiency and the quality of products. The manufacturing system according to the present aspect is thus capable of helping to prevent the reduction in the production efficiency and the quality of products.

The display method according to another aspect of the present disclosure is a display method of displaying productivity of a manufacturing facility that performs a plurality of processes to manufacture products. Here, the manufacturing facility includes a plurality of constituent element groups, each including a plurality of constituent elements, a plurality of constituent elements selected from the plurality of constituent element groups perform a corresponding one of the plurality of processes, the plurality of constituent element groups include a first constituent element group including a plurality of first constituent elements and a second constituent element group including a plurality of second constituent elements. Such display method includes: obtaining manufacturing log information from the manufacturing facility; calculating an indicator showing productivity of each of combinations of one of the plurality of first constituent elements and one of the plurality of second constituent elements, based on the manufacturing log information; and displaying the indicator showing the productivity of each of the combinations at a position of an intersection point corresponding to the combination on a grid map including a first axis along which the plurality of first constituent elements are arranged and a second axis along which the plurality of second constituent elements are arranged.

This helps to prevent the reduction in the production efficiency and the quality of products, as in the case of the display device described above.

Also, the program according to another aspect of the present disclosure is a program that causes a computer to execute the above-described display method.

This helps to prevent the reduction in the production efficiency and the quality of products, as in the case of the display device described above.

The following specifically describes the embodiments with reference to the drawings.

Note that each of the following embodiments shows a comprehensive or specific illustration. The numerical values, shapes, materials, structural components, the arrangement and connection of the structural components, steps, the processing order of the steps and so forth shown in the following embodiments are mere examples, and thus are not intended to limit the present disclosure. Of the structural components described in the following embodiments, structural components not recited in any one of the independent claims that indicate the broadest concepts of the present disclosure will be described as optional structural components.

Note that the drawings are schematic diagrams, and thus they are not necessarily precise illustrations. For example, the drawings are not necessarily illustrated to the same scale. Also, substantially identical configurations are assigned the same reference marks throughout the drawings, and repetitive description may be omitted or simplified.

Embodiment 1

[1-1. Configuration]

With reference to FIG. 1, the following first describes the display device according to Embodiment 1 and the configuration of the manufacturing system including such display device. FIG. 1 is a diagram showing the configuration of manufacturing system 10 according to the present embodiment.

As shown in FIG. 1, manufacturing system 10 includes manufacturing facility 20 and display device 100. In manufacturing system 10 according to the present embodiment, manufacturing facility 20 manufactures product 30, and display device 100 displays the productivity of manufacturing facility 20.

Manufacturing facility 20 performs a plurality of processes to manufacture product 30. Manufacturing facility 20 according to the present embodiment is, for example, a component mounter. Product 30 includes substrate 31 and a plurality of components 32 mounted on substrate 31.

Manufacturing facility 20 according to the present embodiment mounts a plurality of components 32 onto substrate 31. More specifically, manufacturing facility 20 is an exemplary manufacturing device on a manufacturing line for product 30. Manufacturing facility 20 mounts a plurality of components 32 onto each of sequentially conveyed substrates 31, thereby conveying out substrates 31 on which components 32 have been mounted (i.e., products 30). Substrates 31 conveyed out (products 30) are then conveyed to a facility such as a manufacturing facility for the subsequent step (e.g., a reflow step) and an inspection facility for inspecting products 30.

Manufacturing facility 20 includes a plurality of constituent element groups, each including a plurality of constituent elements (not illustrated) involved in the manufacture of products 30. A plurality of constituent elements include a feeder for feeding components 32, a nozzle for sucking components 32, a header that holds the nozzle and moves between the feeder and substrate 31 (the lane on which substrate 31 is conveyed) and so forth. Manufacturing facility 20 includes, for example, a feeder group including a plurality of feeders, a nozzle group including a plurality of nozzles, and a header group including a plurality of headers.

A feeder, a nozzle, and a header are examples of a first constituent element, a second constituent element, and a third constituent element, respectively. The feeder group, the nozzle group, and the header group are examples of the first constituent element group, the second constituent element group, and the third constituent element group, respectively.

Product 30 is manufactured by a plurality of processes sequentially performed. A plurality of processes are, for example, individual mounting processes of a plurality of components 32. A plurality of processes may be performed either simultaneously or sequentially.

Display device 100 is a device that displays the productivity of manufacturing facility 20. Display device 100 is, for example, a computer that includes a display. The display and the computer may either be integrated or separated.

Display device 100 obtains manufacturing log information from manufacturing facility 20, and displays the productivity of manufacturing facility 20 on the basis of the obtained manufacturing log information. The manufacturing log information is data showing the records of the respective processes performed by manufacturing facility 20.

Figures 2, 3:
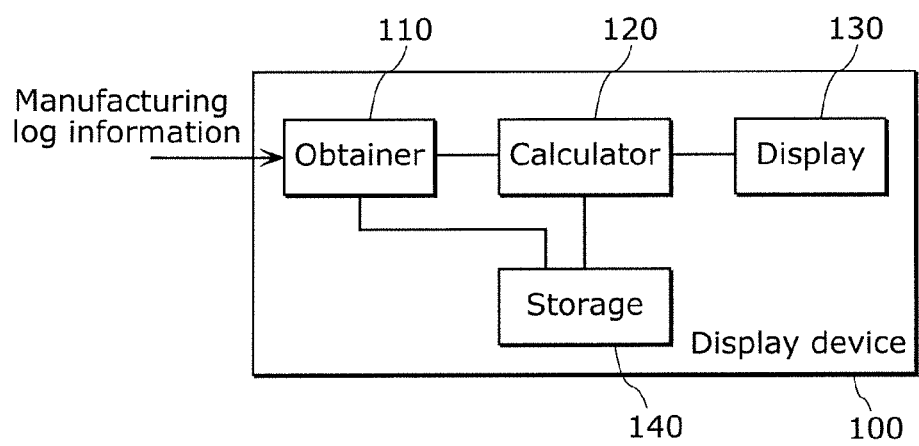
FIG. 2 is a diagram showing exemplary manufacturing log information obtained by a display device according to Embodiment 1.
FIG. 3 is a block diagram of the configuration of the display device according to Embodiment 1.

FIG. 2 is a diagram showing exemplary manufacturing log information obtained by display device 100 according to the present embodiment. As shown in FIG. 2, for each of the processes, the manufacturing log information shows corresponding ones of constituent elements that have performed the process and a record of the process in association with each other.

As shown in FIG. 2, the record of each process includes the time at which the process was performed and a determination result of whether the process has succeeded or failed (failure flag). The time at which the process was performed is, for example, at least one of the start time or the end time of the process. The start time and the end time are represented, for example, by the date indicated by month/date/year and the time indicated by hour: minutes: seconds. Note that the times may be represented in units smaller than seconds such milliseconds.

The determination result of whether each process has succeeded or failed is represented, for example, by a flag (failure flag). In an example of FIG. 2, a failure flag "1" indicates that a process "failed", and a failure flag "0" indicates that a process "succeeded". Note that the record of each process may indicate the presence or absence of an error that has occurred during the process. The presence or absence of an error is indicated by a flag, as in the case of a determination result of whether the process has succeeded or failed.

Note that when a plurality of identifiable failures or error modes are present, determination results of whether the processes have succeeded or failed may be represented, for example, by codes. For example, when error mode 1 and error mode 2 are present, error code "1" may indicate that an error corresponds to error mode "1", error code "2" may indicate that an error corresponds to error mode "2", and error code "0" may indicate that the process includes no error. Examples of a plurality of identifiable failures or error modes include an error of a nozzle failing to suck a component and an error of a sucking position that is largely displaced from the center of a component (i.e., displaced from the correct position) although the component is being sucked.

A plurality of constituent elements that have performed the corresponding process are managed, for example, on a constituent element group basis. The unit A group to the unit C group shown in FIG. 2 correspond to the first constituent element group to the third constituent element group, examples of which are the nozzle group, the feeder group, and the header group. Each item of information represented by a combination of a letter of the alphabet and a three-digit numeric, such as "A001", "B001", and "C001", is an exemplary identification number unique to each constituent element. Identification numbers may be assigned in any manner.

An example in FIG. 2 shows that process P001 was performed by use of unit A with the identification number "A001", unit B with the identification number "B001", and unit C with the identification number "C001". In the following explanation, "unit A001" refers to unit A with the identification number "A001". The same is applicable to "unit B001", "unit C001" and so forth. In FIG. 2, each process is assigned the identification number such as "P001" for easier understanding of the explanation, and thus the manufacturing log information may not include such identification number.

In the present embodiment, one unit is selected for each process from each of the unit A group, the unit B group, and the unit C group, and the selected units perform the corresponding process in cooperation with one another. Note that there may be an unselected unit group depending on the type of a process. For example, a certain process may be performed only by two units, unit A and unit B. Also, a plurality of units may be selected from the same unit group. For example, another process may be performed by two or more units A.

With reference to FIG. 3, the following describes a detailed configuration of display device 100. FIG. 3 is a block diagram of the configuration of display device 100 according to the present embodiment. As shown in FIG. 3, display device 100 includes obtainer 110, calculator 120, display 130, and storage 140.

Obtainer 110 obtains the manufacturing log information from manufacturing facility 20. For example, obtainer 110 obtains the manufacturing log information shown in FIG. 2, and stores the obtained manufacturing log information into storage 140.

Obtainer 110 is, for example, a communication interface for communication with manufacturing facility 20. Such communication may either be wireless communication or wired communication.

Calculator 120 calculates, for each combination of constituent elements, an indicator showing productivity (hereinafter described as productivity indicator), on the basis of the manufacturing log information. More specifically, calculator 120 calculates a productivity indicator of each combination of a first constituent element and a second constituent element. Even more specifically, calculator 120 calculates productivity indicators of all combinations of all of the first constituent elements included in the first constituent element group and all of the second constituent elements included in the second constituent element group. For example, when the first constituent element group includes N first constituent elements (N is a natural number) and the second constituent element group includes M second constituent elements (M is a natural number), calculator 120 calculates a productivity indicator of each of N×M combinations.

Calculator 120 according to the present embodiment further calculates a productivity indicator of each combination of a first constituent element and a third constituent element and each combination of a second constituent element and a third constituent element. Stated differently, calculator 120 selects any two constituent element groups from a plurality of constituent element groups, and calculates a productivity indicator of each combination of constituent elements included in the selected two constituent element groups.

When the manufacturing log information includes no record for a combination, calculator 120 is not required to calculate a productivity indicator of such combination. Stated differently, calculator 120 calculates productivity indicators of only combinations which are associated with the respective records included in the manufacturing log information.

Calculator 120 according to the present embodiment calculates a productivity indicator on the basis of information, included in the manufacturing log information, in which at least one of the start time of the corresponding process or the end time of the process falls within a predetermined data collection period. The data collection period is a target period, the productivity of each process performed during which is calculated. The data collection period is, for example, a period from one to some hours, and from one to some days.

Calculator 120 stores into storage 140 each of the calculated productivity indicators in associated with the corresponding combination. Calculator 120 is implemented, for example, as a processor and so forth that executes a program.

More specifically, a productivity indicator calculated by calculator 120 is at least one of (a) through (k) described below.

(a) a total number of failure processes determined as having failed among one or more of the plurality of processes corresponding to each of the combinations;

(b) a failure rate which is a rate of processes determined as having failed among one or more of the plurality of processes corresponding to each of the combinations;

(c) an error frequency which is a frequency of error occurrence among one or more of the plurality of processes corresponding to each of the combinations;

(d) an occurrence interval which is a time interval at which processes determined as having failed were performed among one or more of the plurality of processes corresponding to each of the combinations;

(e) production time which is time required for one or more of the plurality of processes corresponding to each of the combinations;

(f) standby time which is time to wait to perform one or more of the plurality of processes corresponding to each of the combinations;

(g) termination time which is time during which one or more of the plurality of processes corresponding to each of the combinations were terminated;

(h) a yield of the products manufactured by performing one or more of the plurality of processes corresponding to each of the combinations;

(i) a production plan ratio of the products manufactured by performing one or more of the plurality of processes corresponding to each of the combinations;

(j) an inspection result of inspecting the products manufactured by performing one or more of the plurality of processes corresponding to each of the combinations; or (k) a statistics value calculated by statistically processing at least one of (a) to (j).

A productivity indicator is represented by a numerical value within a predetermined range. For example, when a productivity indicator is any one of (a) the total number of failure processes, (b) failure rate, (c) error frequency, (e) production time, (f) standby time, and (g) termination time, a smaller productivity indicator indicates a higher productivity, whereas a greater productivity indicator indicates a lower productivity. The same is applicable to the case where a productivity indicator is (j) inspection result, and such inspection result indicates the ratio of defective products. The same is also applicable to the case where a productivity indicator is any one of (h) statistics value, and the original data used to calculate such statistics value is any one of (a) the total number of failure processes, (b) failure rate, (c) error frequency, (e) production time, (f) standby time, and (g) termination time.

When a productivity indicator is any one of (d) occurrence interval, (h) yield, and (i) production plan ratio, a greater productivity indicator indicates a higher productivity, whereas a smaller productivity indicator indicates a lower productivity. The same is applicable to the case where a productivity indicator is (j) inspection result, and such inspection result indicates the ratio of non-defective products. The same is applicable to the case where a productivity indicator is (h) statistics value, and the original data used to calculate such statistics value is any one of (d) occurrence interval, (h) yield, and (i) production plan ratio.

For example, calculator 120 extracts, from the manufacturing log information stored in storage 140, all processes corresponding to combinations of first constituent elements and second constituent elements, and reads the records of all processes extracted (more specifically, failure flags). For example, calculator 120 calculates as a productivity indicator the rate of the total number of failure flags (i.e., failure rate) to the total number of flags having been read. Note that a productivity indicator calculated indicates a rate of failure processes among all corresponding combinations, i.e., a failure rate.

Here, an example case will be described of calculating a productivity indicator of a combination of unit A001 and unit B001. In an example of FIG. 2, two combinations of unit A001 and unit B001 are present (more specifically, processes P001 and P006), of which no combination corresponds to a failure flag "1". The productivity indicator of the combinations of unit A001 and unit B001 is thus 0 (=0/2).

In the case of a combination of unit A001 and unit C001, three such combinations are present (more specifically, processes P001 through P003), of which only one combination corresponds to a failure flag "1" (more specifically, process P002). The productivity indicator of the combinations of unit A001 and unit C001 is thus 0.33 (=⅓).

Calculator 120 according to the present embodiment further performs a statistical process on each row or column that lies along one of the first axis and the second axis on productivity indicator map 200 (see FIG. 4) displayed by display 130, thereby determining the presence or absence of an abnormality in a constituent element corresponding to such row or column, or calculating an abnormality degree of a constituent element corresponding to such row or column. Concrete processes will be described later with reference to FIG. 9 through FIG. 11.

Display 130 displays productivity indicators calculated by calculator 120. More specifically, display 130 displays the productivity indicator of each combination at a position of an intersection point corresponding to such combination on a grid map that includes the first axis along which a plurality of first constituent elements are arranged and the second axis along which a plurality of second constituent elements are arranged. Display 130 also displays abnormality determination results or abnormality degrees obtained by calculator 120. More specifically, display 130 displays productivity indicator map 200 shown in FIG. 4. Productivity indicator map 200 will be described in detail later.

Examples of display 130 include but are not limited to a flat panel display such as a liquid crystal display (LCD) and an organic electroluminescence (EL) display device.

Storage 140 is a memory that stores the manufacturing log information obtained from manufacturing facility 20, productivity indicators calculated and so forth. Storage 140 is a nonvolatile memory such as a hard disk drive (HDD) and a semiconductor memory.

[1-2. Productivity Indicator Map]

Figure 4:
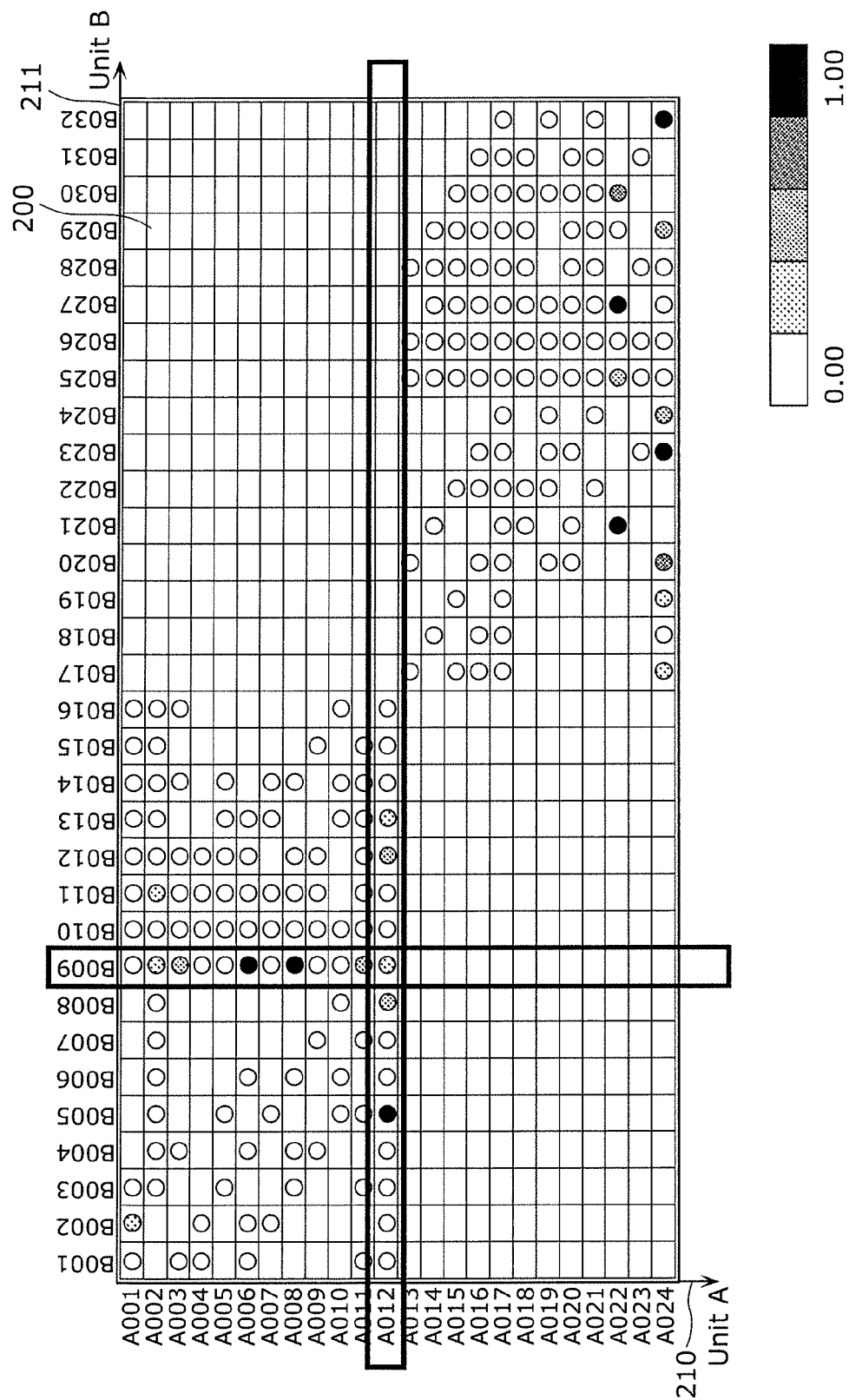
FIG. 4 is a diagram showing an exemplary productivity indicator map displayed by the display device according to Embodiment 1.

With reference to FIG. 4, the following describes a productivity indicator map displayed by display 130 according to the present embodiment. FIG. 4 is a diagram showing an example of productivity indicator map 200 displayed by display device 100 according to the present embodiment.

Productivity indicator map 200 is a two-dimensional grid map having vertical axis 210 and horizontal axis 211 that are perpendicular to each other. Vertical axis 210 is an example of the first axis. As shown in FIG. 4, a plurality of first constituent elements (more specifically, units A) included in the first constituent element group are arranged along vertical axis 210. Horizontal axis 211 is an example of the second axis. A plurality of second constituent elements (more specifically, units B) included in the second constituent element group are arranged along horizontal axis 211. Note that both units A and units B are arranged in ascending order of identification number, but they may be arranged in descending order or in random order.

In productivity indicator map 200, the productivity indicator of a combination of corresponding first constituent element and second constituent element is shown at the intersection point of the row to which such first constituent element belongs and the column to which such second constituent element belongs. More specifically, productivity indicator map 200 is a heat map that represents productivity indicators by color.

Even more specifically, predetermined colors are defined in advance in accordance with the values of productivity indicators. In the present embodiment, circles, each having a color defined in accordance with the value of the productivity indicator of the corresponding combination, are arranged at intersection points corresponding to the combinations. Note that the outer line of each circle may have the same color as that of the inside of such circle, or only the outer line of each circle may have the color corresponding to the value of the productivity indicator, with the inside of such circle being white or another color.

For example, a productivity indicator can fall within a value range from 0.00 to 1.00. In an example of FIG. 4, such range is divided into five ranges, each of which are assigned a color different from one another. For example, blue, green, yellow, orange, and red are assigned in stated order to ranges, starting with a first range for the smallest productivity indicator toward a fifth range for the greatest productivity indicator. Note that FIG. 4 represents variations in color by differently shading the inside of the circles. Instead of using colors, the ranges of productivity indicators may be differentiated from one another by the variations in dot density or the type of shading as shown in FIG. 4.

For example, calculator 120 divides and sets the productivity indicator range. More specifically, calculator 120 performs clustering on all calculated productivity indicators as input data, thereby dividing and setting the productivity indicator range. Examples of clustering include but are not limited to the Ward's method and k-means clustering. Also, the productivity indicator range is not limited to be divided into five, and thus is divided into at least two. Alternatively, calculator 120 may divide the productivity indicator range into equal parts.

Note that a combination, the intersection point of which includes no circle, indicates that its record is not included in the manufacturing log information.

Productivity indicator map 200 may represent productivity indicators by variations in size. More specifically, productivity indicator map 200 may represent a circle, indicating a productivity indicator, having a greater space as the productivity indicator is greater. Instead of a circle, a productivity indicator may be represented by another shape such as square, star, and diamond.

Figure 5:
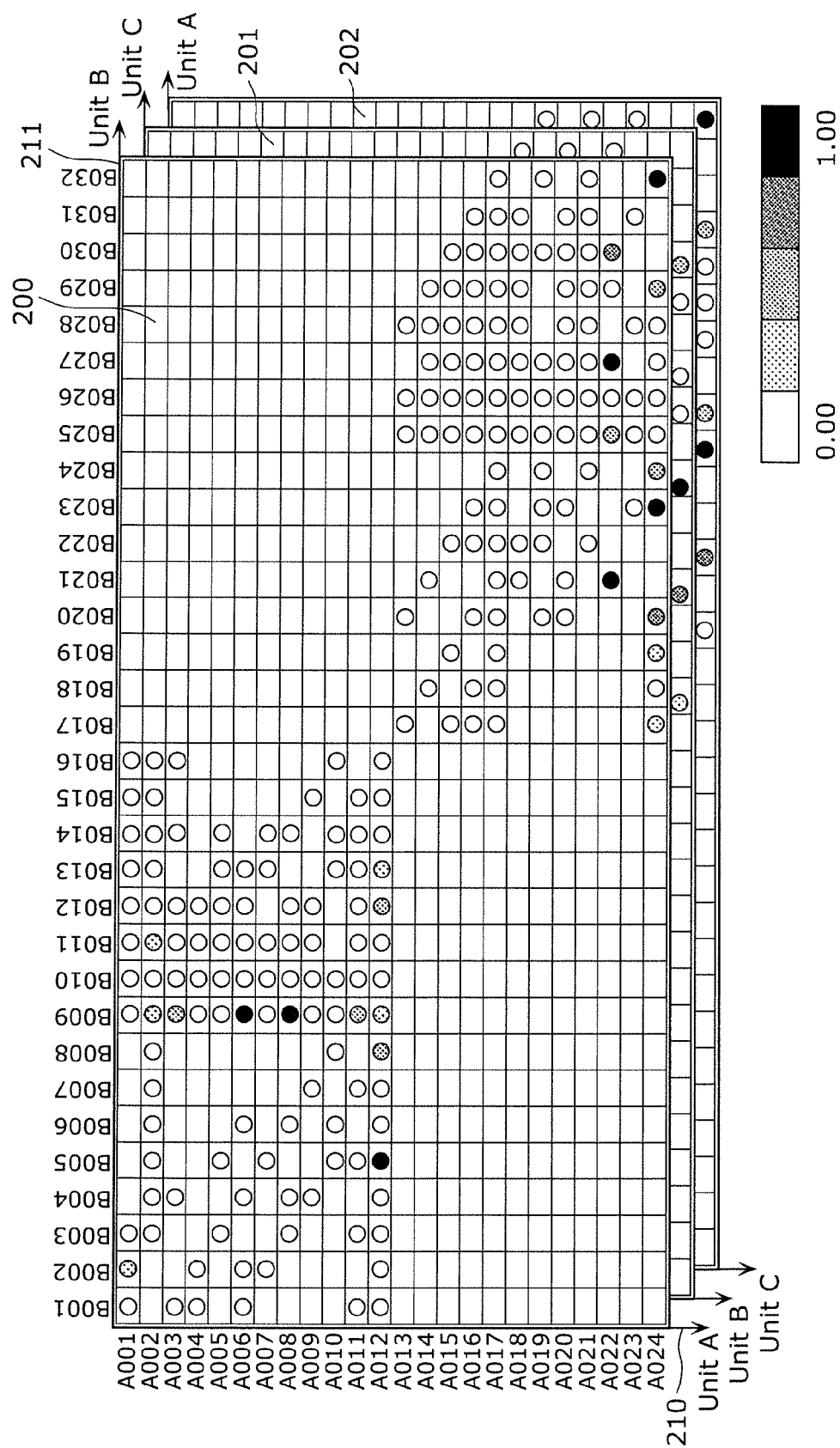
FIG. 5 is a diagram showing another example of productivity indicator maps displayed by the display device according to Embodiment 1.

In the present embodiment, a plurality of productivity indicator maps 200 are generated for each combination of constituent element groups. FIG. 4 shows an example of displaying only one productivity indicator map 200, but the present disclosure is not limited to this. FIG. 5 is a diagram showing another example of productivity indicator maps displayed by display device 100 according to the present embodiment. As shown in FIG. 5, three productivity indicator maps 200 through 202 are arranged, overlapping with each other.

In productivity indicator map 201, units B are arranged along vertical axis 210 and units C are arranged along horizontal axis 211. Productivity indicator map 201 shows productivity indicators of combinations of units B and units C.

In productivity indicator map 202, units C are arranged along vertical axis 210 and units A are arranged along horizontal axis 211. Productivity indicator map 202 shows productivity indicators of combinations of units C and units A.

Of productivity indicator maps 200 through 202, the map displayed at the very front may be switched to another through an operation from, for example, an operator. Alternatively, productivity indicator maps 200 through 202 may be arranged in a tiled manner on a single screen.

As described above, productivity indicator map 200 according to the present embodiment two-dimensionally displays the indicators, each representing the productivity of each combination of constituent elements, and thus enables an easy recognition of whether the productivity is good or poor on a constituent element basis. This thus enables an easier estimation of a constituent element with poor productivity.

[1-3. First Operation (Displaying of Grid Map)]

Figure 6:
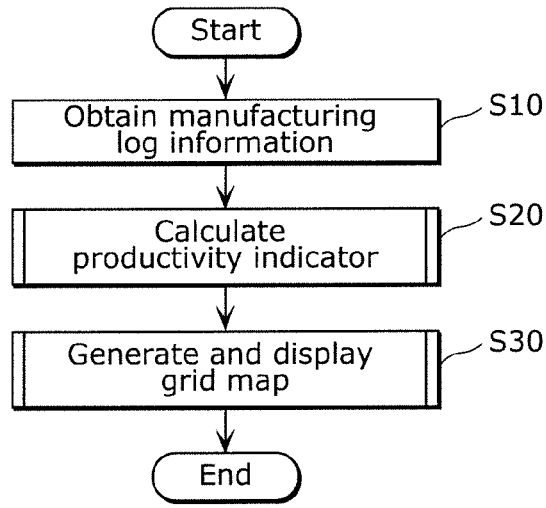
FIG. 6 is a flowchart of a first operation performed by the display device according to Embodiment 1.

With reference to FIG. 6, the following describes a first operation (displaying of a grid map) performed by display device 100 according to the present embodiment. FIG. 6 is a flowchart of the first operation (the display method) performed by display device 100 according to the present embodiment. More specifically, FIG. 6 shows processes of displaying productivity indicator map 200 performed by display device 100.

As shown in FIG. 6, obtainer 110 first obtains manufacturing log information from manufacturing facility 20 (S10). For example, every time manufacturing facility 20 performs a process, obtainer 110 obtains manufacturing log information on such process. Alternatively, obtainer 110 may obtain manufacturing log information, at intervals of a predetermined period, on processes performed during such period. The predetermined period, for example, is one to some hours and one to some days. Obtainer 110 stores the obtained manufacturing log information into storage 140.

Figure 7:
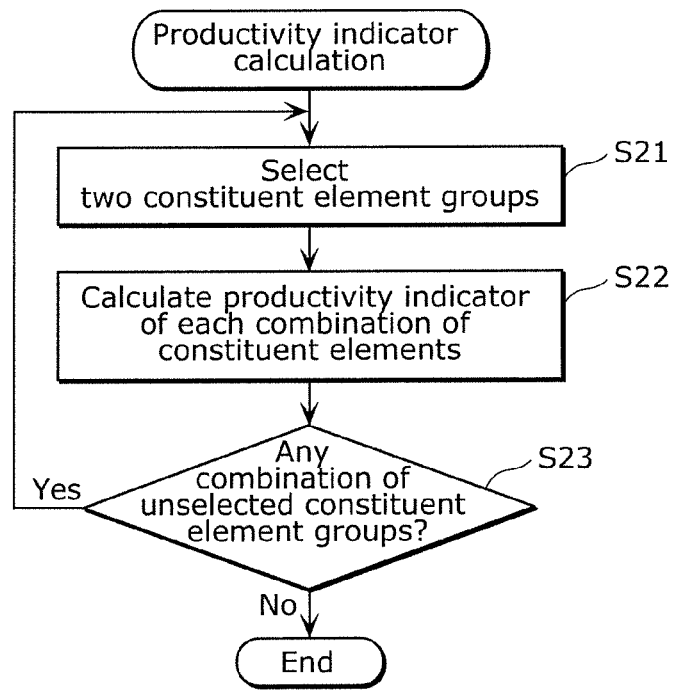
FIG. 7 is a flowchart of processes of calculating productivity indicators performed by the display device according to Embodiment 1.

Next, calculator 120 calculates a productivity indicator of each combination of constituent elements (S20). Calculator 120 stores the calculated productivity indicators into storage 140. With reference to FIG. 7, processes of calculating productivity indicators will be described in detail. FIG. 7 is a flowchart of processes of calculating productivity indicators performed by display device 100 according to the present embodiment.

As shown in FIG. 7, calculator 120 selects two constituent element groups from a plurality of constituent element groups (S21). The description here explains an exemplary case where calculator 120 has selected the unit A group and the unit B group. The unit A group includes, for example, 24 units of A001 through A024, and the unit B group includes, for example, 32 units of B001 through B032.

Calculator 120 then calculates a productivity indicator of each combination of constituent elements (S22). More specifically, calculator 120 selects one unit from units A001 through A0024 included in the unit A group and one unit from units B001 through B0032 included in the unit B group, and calculates a productivity indicator of a combination of the selected unit A and unit B. Calculator 120 calculates a productivity indicator of each of all combinations of units A001 through A024 and units B001 through B032 (24×32=768 patterns). Calculator 120 does not calculate a productivity indicator of a combination when the manufacturing log information includes no information corresponding to such combination.

When a combination of unselected constituent element groups is present (Yes in S23), calculator 120 selects other two constituent element groups from a plurality of constituent element groups. For example, calculator 120 selects the unit B group and the unit C group, and calculates productivity indicators as in the case of selecting the unit A group and the unit B group. Upon completion of the calculation of the productivity indicator of each of all combinations of two constituent element groups selected from a plurality of constituent element groups (No in S23), display device 100 ends the processes of calculating productivity indicators.

With reference to FIG. 6 again, display 130 generates and displays productivity indicator maps (grid maps) 200 through 202 (S30). With reference to FIG. 8, processes of generating and displaying productivity indicator maps 200 through 202 will be described in detail. FIG. 8 is a flowchart of processes of displaying productivity indicator maps 200 through 202 performed by display device 100 according to the present embodiment.

As shown in FIG. 8, display 130 selects two constituent element groups from a plurality of constituent element groups (S31). Display 130 then arranges the selected two constituent element groups along each of vertical axis 210 and horizontal axis 211 (S32). More specifically, as shown in FIG. 4, display 130 arranges vertical axis 210 and horizontal axis 211, where the names (labels) of units A001 through A024 are arranged at the left of vertical axis 210 and the names (labels) of units B001 through B032 are arranged above horizontal axis 211.

Display 130 further arranges each productivity indicator calculated by calculator 120 at a position of the intersection point of the corresponding combination (S33). Display 130 arranges each of all productivity indicators calculated at the intersection point of the corresponding combination. Through these processes, productivity indicator map 200 as shown in FIG. 4 and FIG. 5 is generated and displayed.

When a combination of unselected constituent element groups is present (Yes in S34), display 130 returns to step S31 to select other two constituent element groups from a plurality of constituent element groups and repeat the process of arranging constituent elements and productivity indicators. For example, display 130 selects the unit B group and the unit C group, and generates and displays productivity indicator map 201 as in the case of selecting the unit A group and the unit B group.

Upon completion of displaying the productivity indicator of each of all combinations of two constituent element groups selected from a plurality of constituent element groups (No in S34), display device 100 ends the processes of displaying productivity indicator maps. Through these processes, as shown in FIG. 5, a plurality of productivity indicator maps 200 through 202 are generated and displayed.

Note that when only one productivity indicator map needs to be displayed, the above-described steps S31 through S33 are simply required to be performed only once. Such case occurs when, for example, an instruction is provided from an operator, etc., the details of which will be described in Embodiment 2.

Also note that FIG. 4 and FIG. 5 show vertical axis 210 arranged at the left side and horizontal axis 211 arranged at the upper side, but vertical axis 210 may be arranged at the right side and horizontal axis 211 may be arranged at the lower side. The names of the respective constituent elements are arranged along the corresponding axis without any overlapping with another constituent element.

[1-4. Second Operation (Abnormality Determination)]

The following describes a second operation (abnormality determination) performed by display device 100 according to the present embodiment. FIG. 9 is a flowchart of the second operation performed by display device 100 according to the present embodiment.

First, as shown in FIG. 9, calculator 120 selects a row or a column in productivity indicator map 200 (S40). FIG. 4 shows, for example, the row corresponding to unit A012 or the column corresponding to unit B009 having been selected, with a thick-line frame placed on such selected row or column.

Figures 10, 11:
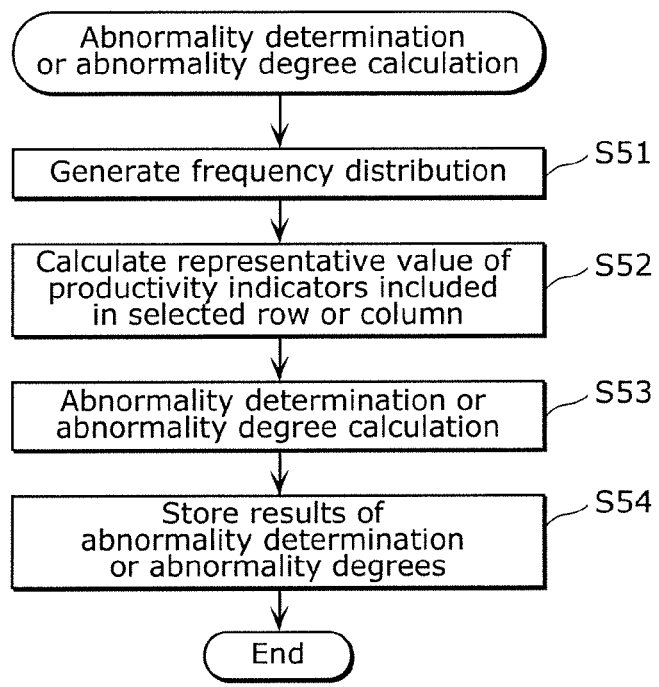
FIG. 10 is a flowchart of processes of abnormality determination or abnormality degree calculation performed by the display device according to Embodiment 1.
FIG. 11 is a diagram showing an abnormality determination result and an abnormality degree of each constituent element displayed by the display device according to Embodiment 1.

Calculator 120 determines the presence or absence of an abnormality in a constituent element corresponding to the selected row or column, or calculates an abnormality degree, on the basis of the productivity indicators included in the selected row or column (S50). With reference to FIG. 10, abnormality determination or abnormality degree calculation will be described in detail. FIG. 10 is a flowchart of processes of abnormality determination or abnormality degree calculation performed by display device 100 according to the present embodiment.

As shown in FIG. 10, calculator 120 generates a frequency distribution (normal distribution) on the basis of all productivity indicators included in productivity indicator map 200 (S51). In the frequency distribution, the horizontal axis is represented by productivity indicators and the vertical axis by the frequency (the number of productivity indicators). Calculator 120 calculates, for example, mean value (overall mean value) $\mu$ of all productivity indicators included in productivity indicator map 200 and standard deviation $\sigma$.

Calculator 120 then calculates the representative value of the productivity indicators included in the selected row or column (S52). More specifically, calculator 120 calculates, as the representative value, a value such as the mean value and the intermediate value of the productivity indicators included in the selected row or column. When selecting the column corresponding to unit B009, for example, calculator 120 calculates the mean value of 12 productivity indicators corresponding to unit B009.

Calculator 120 calculates a deviation rate of such mean value from overall mean value $\mu$, thereby determining the presence or absence of an abnormality (S53). Calculator 120 determines that unit B009 has an abnormality when, for example, the mean value of the productivity indicators corresponding to unit B009 is greater than $\mu+2\sigma$. Note that the present description uses $\mu+2\sigma$ as a threshold for abnormality determination, but the threshold may also be $\mu+\sigma$ or $\mu+3\sigma$.

Alternatively, calculator 120 may calculate an abnormality degree of the representative value (e.g., the mean value) of the productivity indicators included in the selected row or column. The abnormality degree is, for example, negative log likelihood. More specifically, an abnormality degree is calculated by ((calculated mean value−mean $\mu$)/standard deviation $\sigma$)^2.

Subsequently, calculator 120 stores the result of abnormality determination or the calculated abnormality degree into storage 140 (S54).

With reference to FIG. 9 again, calculator 120 repeats the selection of a row or a column, and abnormality determination or abnormality degree calculation of the selected row or column until the selection of all rows or columns completes (Yes in S60). Upon completion of the selection of all rows or columns, and abnormality determinations or abnormality degree calculations (No in S60), display 130 displays the results of the abnormality determinations or the abnormality degrees (S70).

Display 130 displays, for example, a list of abnormality determination results and abnormality degrees as shown in FIG. 11. FIG. 11 is a diagram showing the abnormality determination result and the abnormality degree of each constituent element displayed by display device 100 according to the present embodiment. As shown in FIG. 11, the result of abnormality determination and the abnormality degree is shown on a constituent element basis.

Note that display 130 may display only one of the abnormality determination results and abnormality degrees. Also note that although an example of FIG. 11 represents abnormality degrees by two levels of "high" and "low", but abnormality degrees may be represented by the calculated values per se.

[1-5. Summary]

As described above, display device 100 and the display method according to the present embodiment two-dimensionally display on a grid map the indicators, each representing the productivity of each combination of constituent elements, and thus enable an easy recognition of whether the productivity is good or poor on a constituent element basis. This thus enables an easier estimation of a constituent element with poor productivity.

Also, the results of abnormality determinations on the constituent elements or abnormality degrees are displayed, thereby enabling quicker handling of a constituent element with poor productivity. This saves a person in charge, such as a maintenance worker, a manufacturing worker (operator), a manager of the manufacturing location, a person responsible for production management, from the trouble of inspecting and identifying the point of an abnormality. This thus enables quick handling of a constituent element displayed.

As thus described, display device 100 and the display method according to the present embodiment enable an easier estimation of a constituent element with poor productivity, and thus quick handling of the constituent element with poor productivity. Display device 100 and the display method according to the present embodiment are thus capable of helping to prevent the reduction in the production efficiency and the quality of products.

[1-6. Variation]

The following describes a variation of the productivity indicator map displayed by display device 100 according to the present embodiment.

The present embodiment displays a two-dimensional grid map relating to two constituent element groups selected from a plurality of constituent element groups (more specifically, productivity indicator map 200 shown in FIG. 4), but may display a three-dimensional grid map relating to three constituent element groups.

Figure 12:
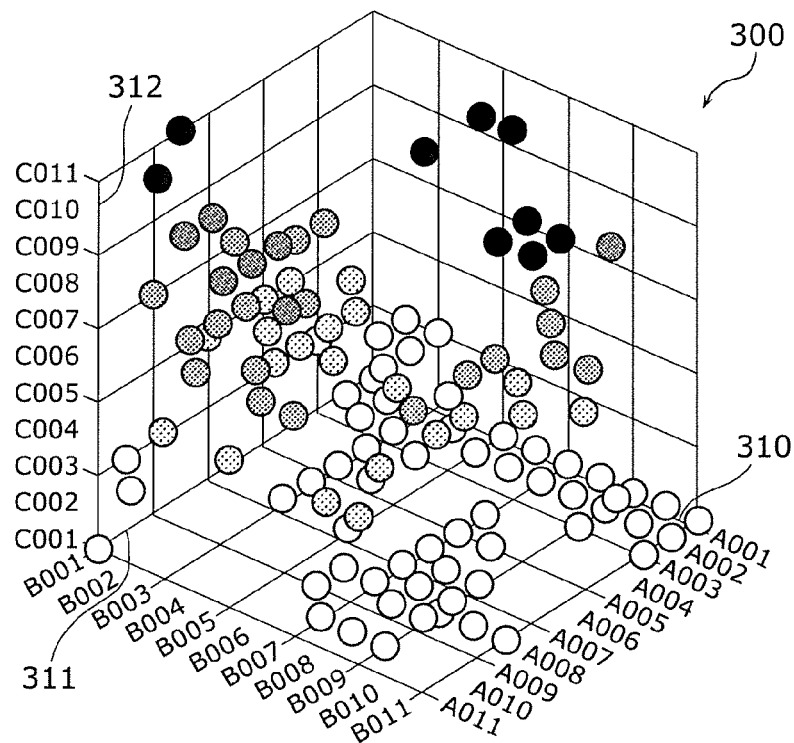
FIG. 12 is a diagram showing an exemplary productivity indicator map according to a variation of Embodiment 1 displayed by the display device.

FIG. 12 is a diagram showing productivity indicator map 300 according to the present variation displayed by display device 100. As shown in FIG. 12, productivity indicator map 300 includes first axis 310 along which the unit A group is arranged, second axis 311 along which the unit B group is arranged, and third axis 312 along which the unit C group is arranged. First axis 310, second axis 311, and third axis 312 are perpendicular to one another. The unit A group, the unit B group, and the unit C group are examples of the first constituent element group, the second constituent element group, and the third constituent element group, respectively.

In the present variation, calculator 120 calculates a productivity indicator of each combination of a first constituent element, a second constituent element, and a third constituent element on the basis of manufacturing log information. Display 130 arranges such calculated productivity indicator at the intersection point of these three constituent elements.

As described above, the indicator representing the productivity of each combination of three constituent elements is displayed on a single screen in an easy to recognize manner. This enables relationships among constituent elements to be more easily understood, thus allowing for an easier estimation of a constituent element with poor productivity.

Embodiment 2

The following describes Embodiment 2.

Embodiment 1 generates and displays a productivity indicator map for all combinations of two constituent element groups that are selectable from a plurality of constituent element groups. In contrast to this, a display device according to Embodiment 2 accepts a user's instruction and calculates and displays a productivity indicator on the basis of such accepted instruction, as in the case of the display device according to Embodiment 1.

[2-1. Configuration]

Figure 13:
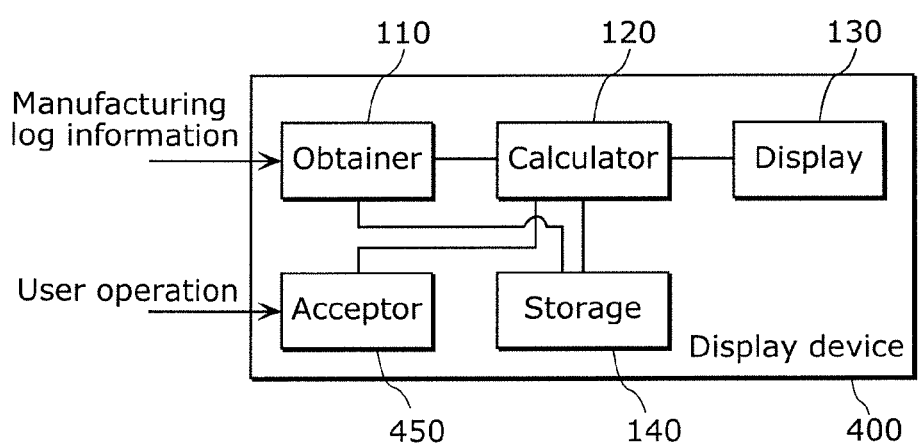
FIG. 13 is a block diagram of the configuration of a display device according to Embodiment 2.

With reference to FIG. 13, the following describes the configuration of the display device according to the present embodiment. FIG. 13 is a block diagram of the configuration of display device 400 according to the present embodiment.

As shown in FIG. 13, display device 400 is different from display device 100 according to Embodiment 1 in that display device 400 newly includes acceptor 450. The following focuses on the difference from Embodiment 1, with the descriptions of the common points omitted or simplified.

Acceptor 450 is a user interface for accepting an instruction form the user. Examples of the user include but are not limited to a manufacturing worker (operator) in the manufacturing location who operates the manufacturing facility for production (manufacture). Other examples of the user include: a person in charge of instruction and supervision in the manufacturing location; a manager of the manufacturing location in charge of schedule control and quality control; and a person in charge of production control who makes a daily production plan on the basis of the production plan and manages the records. Alternatively, the user may be a maintenance worker and so forth. Acceptor 450 is more specifically a touch sensor integrated with display 130, or a physical button, etc.

Acceptor 450 according to the present embodiment accepts a user's selection of two constituent element groups included in a plurality of constituent element groups. Two constituent element groups selected by the user are constituent element groups that are arranged along vertical axis 210 and horizontal axis 211 on productivity indicator map 200. For example, acceptor 450 causes display 130 to display a plurality of constituent element groups selectable by the user to prompt the user to touch and select constituent element groups, thereby accepting the selection of two constituent element groups.

Acceptor 450 also accepts an instruction concerning a data collection period. For example, acceptor 450 accepts from the user the start time and the end time of the data collection period. Alternatively, acceptor 450 may accept the start time of the data collection period and its duration. Calculator 120 calculates productivity indicators on the basis of the data collection period accepted by acceptor 450.

[2-2. Operation]

Figure 14:
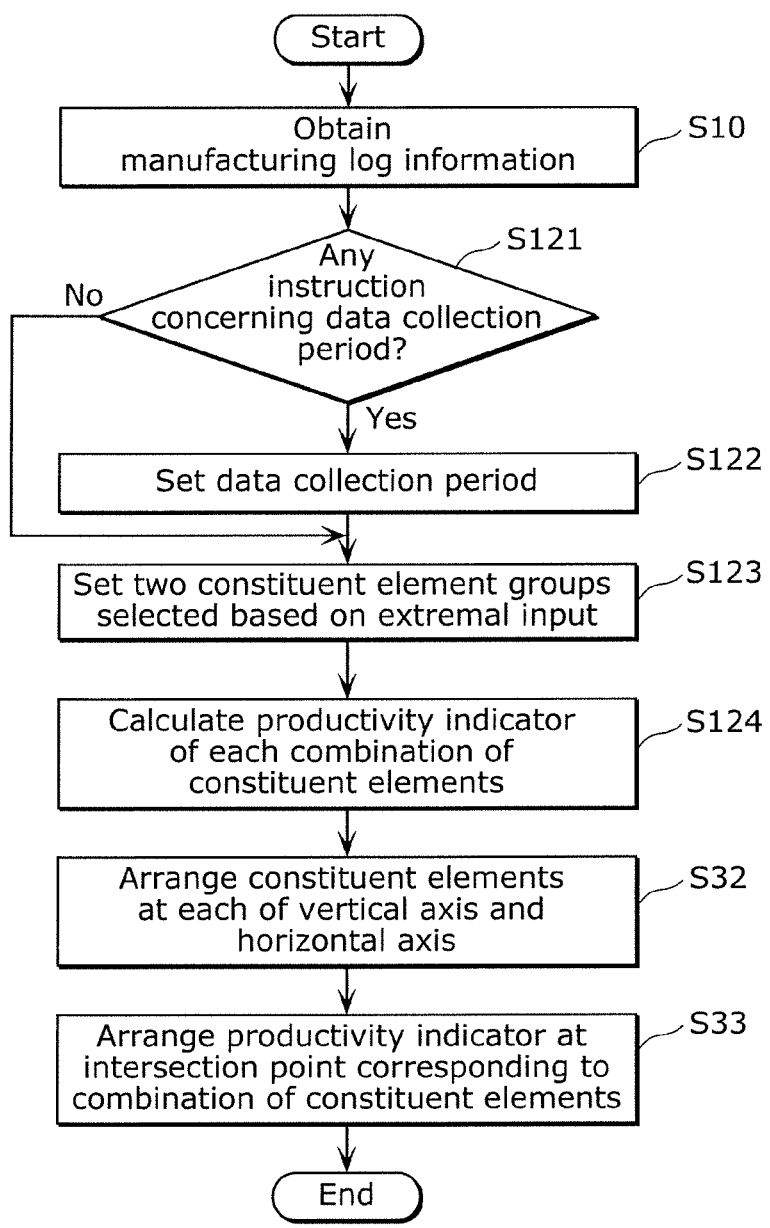
FIG. 14 is a flowchart of processes of calculating productivity indicators performed by the display device according to Embodiment 2.

With reference to FIG. 14, the following describes the operation performed by display device 400 according to the present embodiment. FIG. 14 is a flowchart of the operation performed by display device 400 according to the present embodiment.

First, as shown in FIG. 14, obtainer 110 obtains manufacturing log information from manufacturing facility 20 (S10). The concrete process is similar to that of Embodiment 1.

Next, when acceptor 450 has accepted an instruction concerning a data collection period (Yes in S121), calculator 120 sets the data collection period (S122). When the data collection period has been set, productivity indicators are calculated only for a period corresponding to the processes, included in the manufacturing log information, the start time or the end time of which falls within the data collection period. When no instruction concerning a data collection period has been accepted (No in S122), productivity indicators are calculated for all information in the manufacturing log information.

Next, calculator 120 sets the two constituent element groups, which have been selected on the basis of an external input, as constituent element groups to be arranged along vertical axis 210 and horizontal axis 211 in productivity indicator map 200 (S123). More specifically, acceptor 450 accepts from the operator, etc. an input of the selection of two constituent element groups. Calculator 120 then sets such two constituent element groups selected through the input accepted by acceptor 450 as calculation targets, the productivity indicators of which are to be calculated.

Next, calculator 120 calculates a productivity indicator of each combination of constituent elements included in the two constituent element groups having been set (S124). The concrete process is similar to that of step S21 according to Embodiment 1.

Subsequently, display 130 arranges the selected two constituent element groups along vertical axis 210 and horizontal axis 211 (S32). Display 130 further arranges each productivity indicator calculated by calculator 120 at the intersection point of the corresponding combination (S33). These processes are the same as steps S32 and S34 shown in FIG. 8.

Through these processes, productivity indicator map 200 shown in FIG. 4, for example, is generated and displayed. In the present embodiment, two constituent element groups arranged along vertical axis 210 and horizontal axis 211 in productivity indicator map 200 are based on the instruction accepted by acceptor 450. Stated differently, the productivity indicators shown in productivity indicator map 200 are productivity indicators of combinations selected by a person such as a maintenance worker or an operator.

As described above, the present embodiment generates productivity indicator map 200 relating to two constituent element groups selected by a person such as a maintenance worker or an operator. This saves the amount of processing required for calculation or display, etc., since no calculation of productivity indicators is performed or no generation and display of a productivity indicator map is performed when not selected by a person.

OTHER EMBODIMENTS

The display device, the manufacturing system, and the display method according to one or more aspects have been described above on the basis of the embodiments, but the present disclosure is not limited to these embodiments. The scope of the present disclosure also includes variations achieved by making various modifications and alternations to the present embodiments that can be conceived by those skilled in the art without departing from the essence of the present disclosure, and embodiments achieved by combining structural components in different embodiments.

For example, the above embodiments show an example of representing productivity indicators by variations in color or size, but the present disclosure is not limited to this. The numerical values indicating productivity indicators may be arranged on the corresponding intersection points in the productivity indicator map.

Also, although one constituent element group is arranged, for example, along each of vertical axis 210 and horizontal axis 211, a plurality of constituent element groups may be arranged. For example, the unit A group may be arranged along vertical axis 210, and the unit B group and the unit C group may be arranged along horizontal group 211. This enables simultaneous display of combinations of units A and units B, and combinations of units A and units C.

In this case, combinations of units B and units C may be arranged on one column on horizontal axis 211. For example, a combination of unit B001 and unit C001 is arranged on one column, and a combination of unit B001 and unit C002 is arranged on another column. All combinations of units B and units C may be arranged on horizontal axis 211. This enables the productivity indicators of combinations of three units, units A, units B, and units C, to be displayed on a two-dimensional grid map.

Also, although the above description uses a component mounter as an example of manufacturing facility 20, the present disclosure is not limited to this. Examples of manufacturing facility 20 may thus include a processing device that processes materials such as metal and resin, and a formation device that forms a processed material.

In the display device according to the present disclosure, for example, the manufacturing facility may include N constituent element groups, each including a plurality of constituent elements (N is a natural number equal to or greater than 2), and N constituent elements selected from one each from the N constituent element groups may perform a corresponding one of a plurality of processes. In this case, the display device may include: an obtainer that obtains manufacturing log information from the manufacturing facility; a calculator that calculates an indicator showing the productivity of each combination of M constituent elements selected from one each from M constituent element groups (M is a natural number that satisfies $2 \leq M \leq N$), on the basis of the manufacturing log information; and a display that displays the indicator showing the productivity of each combination at a position corresponding to the intersection point corresponding to the combination in an M-dimensional grid, where the M constituent element groups serves as axes.

Moreover, (1) each of the above-described devices may be more specifically a computer system that includes a microprocessor, a ROM, a RAM, a hard disk unit, a display unit and so forth. The random access memory (RAM) or the hard disk unit stores a computer program. The microprocessor's operating in accordance with the computer program enables each of the devices to accomplish its function. Here, the computer program is implemented by a combination of a plurality of command codes indicating instructions to the computer to achieve a predetermined function.

(2) One or more, or all of the structural components included in each of the above-described devices may be implemented as a single system large scale integration (LSI). The system LSI is a super-multifunctional LSI that is manufactured by integrating a plurality of components onto a single chip. The system LSI is more specifically a computer system that includes a microprocessor, a read only memory (ROM), a RAM and so forth. The RAM stores a computer program. The microprocessor's operating in accordance with the computer program enables the system LSI to accomplish its function.

(3) One or more, or all of the structural components included in each of the above-described devices may be implemented as an integrated circuit (IC) card removable from each of the devices or a single module. The IC card or the module is a computer system that includes a microprocessor, a ROM, a RAM and so forth. The IC card or the module may include the above-described super-multifunctional LSI. The microprocessor's operating in accordance with a computer program enables the IC card or the module to accomplish its function. Such IC card or the module may be tamper resistant.

(4) The present disclosure may be the above-described method. The present disclosure may also be a computer program that enables such method to be implemented by a computer, or digital signals that form the computer program.

(5) The present disclosure may be achieved by recording a computer program or digital signals on a computer-readable recording medium such as a flexible disk, a hard disk, a CD-ROM, an MO, a DVD, a DVD-ROM, a DVD-RAM, a Blu-ray® disc (BD), and a semiconductor memory. The present disclosure may also be digital signals recorded in such recording medium.

(6) The present disclosure may transmit the computer program or the digital signals via, for example, a telecommunication line, a wireless or wired communication line, a network represented by the Internet, and data broadcasting.

(7) The present disclosure may be a computer system that includes a microprocessor and a memory, in which the memory stores the computer program and the microprocessor may operate in accordance with the computer program.

(8) The present disclosure may be achieved by transmitting the program or the digital signals recorded on a recording medium or transmitting the program or the digital signals via, for example, a network, thereby enabling another independent computer system to carry out the present disclosure.

Also note that each of the above-described embodiments allows for various modifications, replacements, additions, omissions and so forth made thereto within the scope of the claims and its equivalent scope.

INDUSTRIAL APPLICABILITY

The present disclosure is applicable for use as a display device capable of helping to prevent the reduction in the production efficiency and the quality of products. For example, the present disclosure finds its use in manufacturing management and so forth in a factory.

The invention claimed is:

1. A display device that displays productivity of a manufacturing facility that performs a plurality of processes to manufacture products, the display device comprising:
an obtainer that obtains a manufacturing log information from the manufacturing facility, wherein
the manufacturing facility includes a plurality of constituent element groups, each including a plurality of constituent elements,
each process of the plurality of processes is performed using the plurality of constituent elements in cooperation with one another, the plurality of constituent elements being obtained by selecting at least one constituent element from each of the plurality of constituent element groups for performing said each process, and
the plurality of constituent element groups include a first constituent element group including a plurality of first constituent elements and a second constituent element group including a plurality of second constituent elements;
a calculator that calculates an indicator showing productivity of each of combinations of one of the plurality of first constituent elements and one of the plurality of second constituent elements, based on the manufacturing log information; and
a display that displays the indicator showing the productivity of each of the combinations at a position of an intersection point corresponding to the combination on a grid map including a first axis along which the plurality of first constituent elements are arranged and a second axis along which the plurality of second constituent elements are arranged.

2. The display device according to claim 1,
wherein the calculator further performs a statistical process on each of rows or columns that lie along one of the first axis and the second axis on the grid map to perform one of: a determination of presence or absence of an abnormality in the plurality of constituent elements corresponding to the row or the column; and a calculation of an abnormality degree of the plurality of constituent elements corresponding to the row or the column, and
the display further displays a result of the determination or the abnormality degree.

3. The display device according to claim 1,
wherein, for each of the plurality of processes, the manufacturing log information shows corresponding ones of the plurality of constituent elements that have performed the process and a record of the process in association with each other.

4. The display device according to claim 3,
wherein the record shows at least one of: presence or absence of an error that has occurred during the process associated with the record; start time of the process; end time of the process; or a determination result of whether the process has succeeded or failed.

5. The display device according to claim 3,
wherein the record shows at least one of start time of the process associated with the record or end time of the process, and
the calculator further calculates the indicator based on information, included in the manufacturing log information, in which at least one of the start time of the process or the end time of the process falls within a predetermined data collection period.

6. The display device according to claim 1, further comprising:
an acceptor that accepts two of the plurality of constituent element groups selected by a user, and
the calculator calculates the indicator, with the two of the plurality of constituent element groups accepted by the acceptor serving as the first constituent element group and the second constituent element group.

7. The display device according to claim 1, wherein the grid map is a heat map that represents the indicator by variations in color or size.

8. The display device according to claim 1,
wherein the indicator includes at least one of:
(a) a total number of failure processes determined as having failed among one or more of the plurality of processes corresponding to each of the combinations;
(b) a failure rate which is a rate of processes determined as having failed among one or more of the plurality of processes corresponding to each of the combinations;
(c) an error frequency which is a frequency of error occurrence among one or more of the plurality of processes corresponding to each of the combinations;
(d) an occurrence interval which is a time interval at which processes determined as having failed were performed among one or more of the plurality of processes corresponding to each of the combinations;
(e) production time which is time required for one or more of the plurality of processes corresponding to each of the combinations;
(f) standby time which is time to wait to perform one or more of the plurality of processes corresponding to each of the combinations;
(g) termination time which is time during which one or more of the plurality of processes corresponding to each of the combinations were terminated;
(h) a yield of the products manufactured by performing one or more of the plurality of processes corresponding to each of the combinations;
(i) a production plan ratio of the products manufactured by performing one or more of the plurality of processes corresponding to each of the combinations;
(j) an inspection result of inspecting the products manufactured by performing one or more of the plurality of processes corresponding to each of the combinations; or
(k) a statistics value calculated by statistically processing at least one of (a) to (j).

9. The display device according to claim 1,
wherein the plurality of constituent element groups further include a third constituent element group including a plurality of third constituent elements, and the calculator further calculates the indicator showing productivity of each of combinations of one of the plurality of first constituent elements, one of the plurality of second constituent elements, and one of the plurality of third constituent elements, based on the manufacturing log information.

10. The display device according to claim 9, wherein the grid map is a three-dimensional grid map that further includes a third axis along which the plurality of third constituent elements are arranged.

11. A manufacturing system, comprising:
the display device according to claim 1; and
the manufacturing facility.

12. A display method of displaying productivity of a manufacturing facility that performs a plurality of processes to manufacture products,
the display method comprising:
obtaining a manufacturing log information from the manufacturing facility, wherein
the manufacturing facility includes a plurality of constituent element groups, each including a plurality of constituent elements,
each process of the plurality of processes is performed using the plurality of constituent elements in cooperation with one another, the plurality of constituent elements being obtained by selecting at least one constituent element from each of the plurality of constituent element groups for performing said each process, and
the plurality of constituent element groups include a first constituent element group including a plurality of first constituent elements and a second constituent element group including a plurality of second constituent elements;
calculating an indicator showing productivity of each of combinations of one of the plurality of first constituent elements and one of the plurality of second constituent elements, based on the manufacturing log information; and
displaying the indicator showing the productivity of each of the combinations at a position of an intersection point corresponding to the combination on a grid map including a first axis along which the plurality of first constituent elements are arranged and a second axis along which the plurality of second constituent elements are arranged.

13. A non-transitory computer-readable recording medium that stores a program that causes a computer to execute the display method according to claim 12.

* * * * *